US008847678B2

(12) United States Patent
Chen

(10) Patent No.: US 8,847,678 B2
(45) Date of Patent: Sep. 30, 2014

(54) FREQUENCY COMPENSATION CIRCUIT FOR VOLTAGE REGULATOR

(75) Inventor: Liang Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 300 days.

(21) Appl. No.: 13/283,237

(22) Filed: Oct. 27, 2011

(65) Prior Publication Data

US 2012/0105025 A1 May 3, 2012

(30) Foreign Application Priority Data

Oct. 27, 2010 (CN) .......................... 2010 1 0527694

(51) Int. Cl.
*H03F 1/44* (2006.01)
*G05F 1/575* (2006.01)

(52) U.S. Cl.
CPC ...................................... *G05F 1/575* (2013.01)
USPC ........................................... 330/107; 323/280

(58) Field of Classification Search
USPC ......... 327/112, 212, 312, 362, 480, 490, 538, 327/539, 541, 543, 307; 330/285, 297, 302, 330/273, 279, 107; 323/222, 225, 282–290, 323/277, 273, 280
See application file for complete search history.

(56) References Cited

U.S. PATENT DOCUMENTS 5,047,727 A * 9/1991 Theus ............................... 330/9
5,298,813 A * 3/1994 Tanigawa et al. ............. 327/556
6,208,206 B1 * 3/2001 Leung et al. .................. 330/107
6,977,490 B1 * 12/2005 Zhang et al. .................. 323/280
7,276,969 B1 * 10/2007 Aram ............................ 330/253
7,495,422 B2 * 2/2009 Mok et al. ..................... 323/280
7,777,464 B2 * 8/2010 Jung et al. ..................... 323/275
7,808,311 B2 * 10/2010 Sutardja .......................... 330/98
8,058,931 B1 * 11/2011 Zhou ............................. 330/292
8,072,262 B1 * 12/2011 Burt et al. ......................... 330/9
8,081,032 B1 * 12/2011 Aram ............................ 330/305

FOREIGN PATENT DOCUMENTS

CN 101281410 A 10/2008
CN 101388650 A 3/2009

OTHER PUBLICATIONS

Partial translation of Office Action dated Dec. 28, 2012 in connection with Chinese Patent Application No. 201010527694.6.
Xiaohong Peng, et al., "Transconductance with Capacitances Feedback Compensation for Multistage Amplifiers", IEEE, 2004, p. 143-146.

* cited by examiner

*Primary Examiner* — Rajnikant Patel

(57) ABSTRACT

A frequency compensation circuit for a voltage regulator is provided in embodiments of the present invention. The frequency compensation circuit mainly includes a first transconductance operational amplifier circuit, a second transconductance operational amplifier circuit, and a third transconductance operational amplifier circuit cascaded sequentially, where the first transconductance operational amplifier circuit receives an input voltage to be compensated, and the third transconductance operational amplifier circuit outputs a compensated voltage; and a primary transconductance negative feedback compensation circuit, connected in parallel between an output end of the second transconductance operational amplifier circuit and an output end of the third transconductance operational amplifier circuit, and a secondary transconductance negative feedback compensation circuit, connected in parallel between an output end of the first transconductance operational amplifier circuit and the output end of the third transconductance operational amplifier circuit.

8 Claims, 4 Drawing Sheets

FREQUENCY COMPENSATION CIRCUIT FOR VOLTAGE REGULATOR

CROSS-REFERENCE TO RELATED APPLICATIONS

This application claims priority to Chinese Patent Application No. 201010527694.6, filed on Oct. 27, 2010, which is hereby incorporated by reference in its entirety.

FIELD OF THE INVENTION

The present invention relates to the field of electronic technologies, and in particular, to a frequency compensation circuit for a low drop-out voltage regulator (LDO).

BACKGROUND OF THE INVENTION

An LDO is a linear voltage regulator, and is mainly configured to provide a stable voltage source for a circuit. A main problem encountered in LDO design is frequency compensation of an LDO loop. Good frequency compensation may stabilize the LDO loop, increase a transient response speed of the LDO loop, and reduce static power consumption of the LDO loop.

In the prior art, a frequency compensation solution of an LDO is: adopting current Miller compensation. FIG. 1 is a schematic principle diagram of an LDO loop adopting current Miller compensation. A triangle symbol in the diagram represents a transconductance stage. The transconductance stage is a circuit that converts a voltage into a current, and is represented by gm. A negative sign in front of the gm indicates that a current output by the transconductance stage decreases as an input voltage increases. No negative sign in front of the gm indicates that the current output by the transconductance stage increases as the input voltage increases. In the diagram, r represents an equivalent resistor of a circuit node, and c represents an equivalent capacitor of the circuit node.

FIG. 2 shows an implantation manner of a specific circuit of the principle diagram shown in FIG. 1. An LDO circuit shown in FIG. 2 includes an operational amplifier circuit, an output power tube MP, a reference voltage VBG, two voltage divider resistors R1 and R2, and an external compensation capacitor CL, where Cpar is a parasitic capacitor of a Positive Channel Metal Oxide Semiconductor (PMOS) tube P8. RL represents an external load, Vin is an input voltage, and Vout is an output voltage.

An LDO circuit with an open loop structure shown in FIG. 3 is obtained when the R1 and R2 in FIG. 2 are disconnected. In the case that an output current is smaller than a set value (for example, 1 A), the LDO circuit with the open loop structure shown in FIG. 3 has the following two dominant poles:

$$p_3 = \frac{-1}{r_{01} * C_{par}}$$

$$p_4 = \frac{-1}{r_{02} * C_L},$$

where $r_{01}$ represents an output resistance of an N1 point, $r_{02}$ represents impedance obtained after an output resistance and a load resistance of the Pmos are connected in parallel, and Cpar represents an equivalent parasitic capacitance at the N1 point.

In the implantation of the present invention, the inventor finds that the frequency compensation solution of the LDO in the prior art has at least the following problems:

In the case that a small current is output, if a value of the $r_{01}$ is larger, the pole P3 is located at a lower frequency, which affects the stability of the LDO loop. If the value of the $r_{01}$ is smaller, although the pole P3 is located at a higher frequency, the stability of the LDO loop is desirable. However, the value of the $r_{01}$ is smaller, which causes that an operational amplifier gain of the LDO loop is smaller in the case that a large current is output, so that performances of the LDO loop, such as load regulation, output voltage precision, and power supply noise suppression are deteriorated.

SUMMARY OF THE INVENTION

Embodiments of the present invention provide a frequency compensation circuit for a voltage regulator, so as to achieve that a loop of the frequency compensation circuit is stable in the case that a small current is output, and a frequency compensation gain is larger in the case that a large current is output.

A frequency compensation circuit for a voltage regulator includes:

a first transconductance operational amplifier circuit, a second transconductance operational amplifier circuit, and a third transconductance operational amplifier circuit cascaded sequentially, where the first transconductance operational amplifier circuit receives an input voltage to be compensated, and the third transconductance operational amplifier circuit outputs a compensated voltage; and a primary transconductance negative feedback compensation circuit, connected in parallel between an output end of the second transconductance operational amplifier circuit and an output end of the third transconductance operational amplifier circuit, and a secondary transconductance negative feedback compensation circuit, connected in parallel between an output end of the first transconductance operational amplifier circuit and the output end of the third transconductance operational amplifier circuit.

It can be seen from the technical solution provided in the embodiments of the present invention that, by using a structure of a three-stage transconductance operational amplifier circuit and two-stage compensation circuit, in the case that various types of currents are output, the loop of the frequency compensation circuit of the voltage regulator may be enabled to maintain stable; furthermore, the operational amplifier gain of the frequency compensation circuit may be enabled to be larger.

BRIEF DESCRIPTION OF THE DRAWINGS

To describe the technical solutions according to the embodiments of the present invention more clearly, the accompanying drawings required for describing the embodiments are introduced briefly in the following. Apparently, the accompanying drawings in the following description are only some embodiments of the present invention, and persons of ordinary skill in the art may also derive other drawings from these accompanying drawings without creative efforts.

DETAILED DESCRIPTION OF THE EMBODIMENTS

In order to make objectives, technical solutions, and advantages of the embodiments of the present invention more clearly, the technical solutions in the embodiments of the present invention are described clearly and completely with reference to the accompanying drawings. Obviously, the embodiments described are only a part rather than all of the embodiments of the present invention. Based on the embodiments of the present invention, other embodiments obtained by persons of ordinary skill in the art without creative efforts shall all fall within the protection scope of the present invention.

To facilitate the understanding of the embodiments of the present invention, the present invention is further illustrated in the following with reference to the accompanying drawings and several specific embodiments, and each embodiment is not intended to limit the embodiments of the present invention.

Embodiments of the present invention are illustrated in the following by taking an LDO as an example.

Embodiment 1

Figure 1:
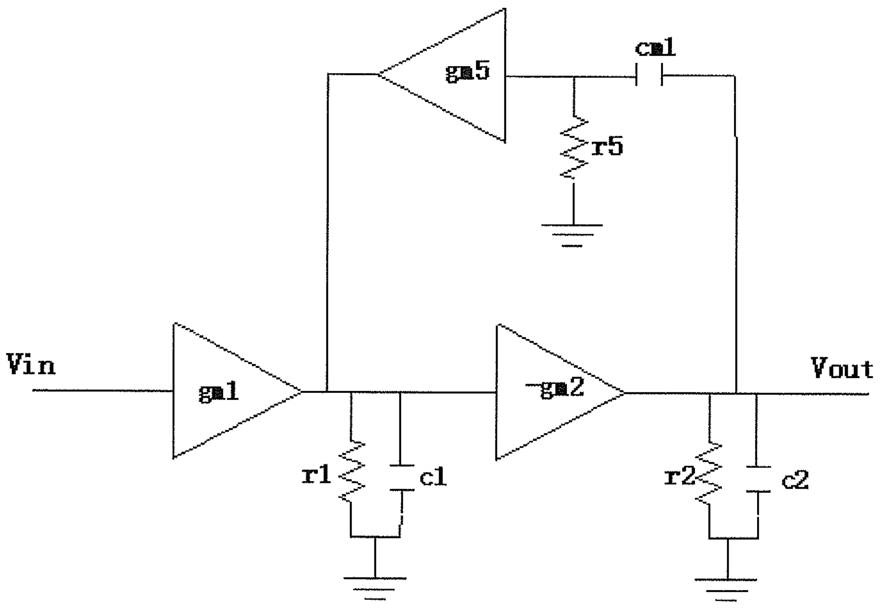
FIG. 1 is a schematic principle diagram of an LDO loop adopting current Miller compensation in the prior art.
Figure 2:
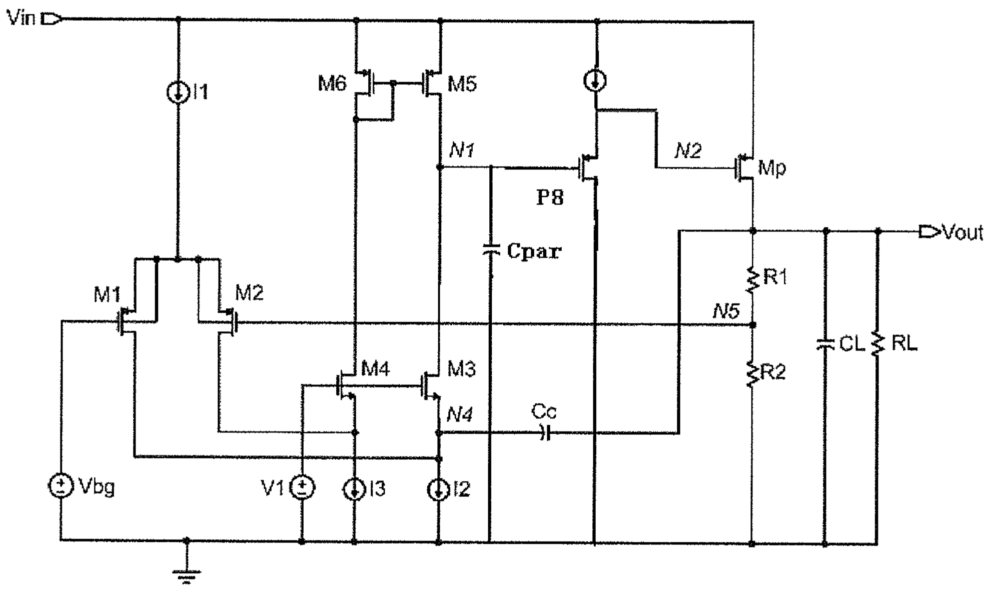
FIG. 2 is a schematic diagram of an implantation manner of a specific circuit of the principle diagram shown in FIG. 1.
Figure 3:
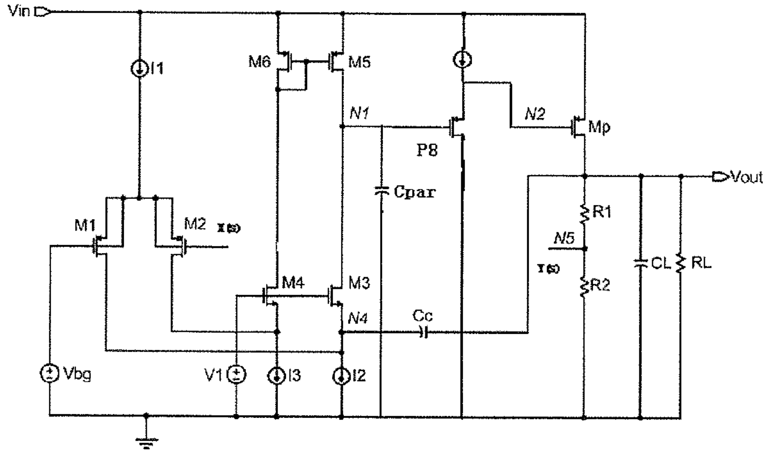
FIG. 3 is an open loop principle diagram of the LDO adopting current Miller compensation obtained by disconnecting R1 from R2 in FIG. 2.
Figure 4:
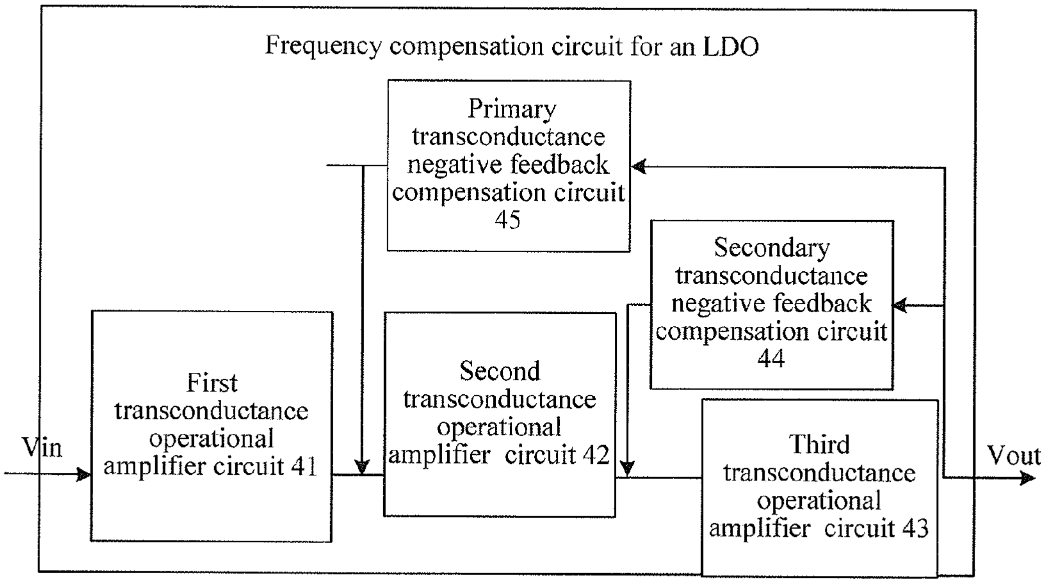
FIG. 4 is a schematic principle diagram of a frequency compensation circuit for an LDO according to a first embodiment of the present invention.

A schematic principle diagram of a frequency compensation circuit for an LDO provided in this embodiment is shown in FIG. 4. The whole frequency compensation circuit specifically includes:

a first transconductance operational amplifier transconductance operational amplifier circuit, a second transconductance operational amplifier circuit, and a third transconductance operational amplifier circuit cascaded sequentially, where the first transconductance operational amplifier circuit receives an input voltage to be compensated Vin, and the third transconductance operational amplifier circuit outputs a compensated voltage Vout.

A secondary transconductance negative feedback compensation circuit is connected in parallel between an output end of the second transconductance operational amplifier circuit and an output end of the third transconductance operational amplifier circuit, and a primary transconductance negative feedback compensation circuit is connected in parallel between an output end of the first transconductance operational amplifier circuit and the output end of the third transconductance operational amplifier circuit.

Through three-stage amplification is performed by the first transconductance operational amplifier circuit, the second transconductance operational amplifier circuit, and the third transconductance operational amplifier circuit, to ensure that the frequency compensation circuit has a larger operational amplifier gain. When an output current of the frequency compensation circuit is larger than a set value, the primary transconductance negative feedback compensation circuit and the secondary transconductance negative feedback compensation circuit perform frequency negative feedback compensation processing.

Embodiment 2

Figure 5:
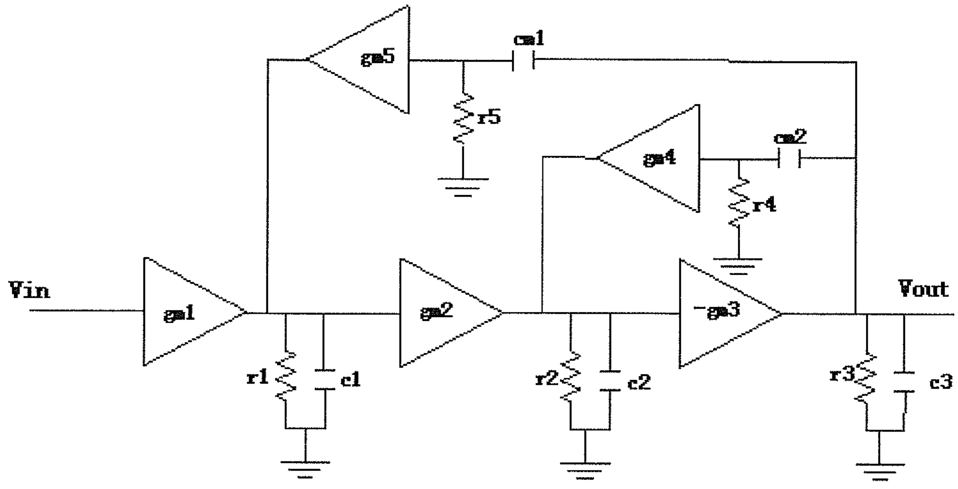
FIG. 5 is a schematic circuit diagram of specific implementation of a frequency compensation circuit for an LDO according to a second embodiment of the present invention.

A schematic circuit diagram of specific implementation of a frequency compensation circuit for an LDO provided in this embodiment is shown in FIG. 5. The whole frequency compensation circuit specifically includes: equivalent resistors r1, r2, r3, r4, and r5; equivalent capacitors c1, c2, and c3; compensation capacitors cm1 and cm2; and transconductance stages gm1, gm2, −gm3, gm4, and gm5. Resistances of the equivalent resistors r1, r2, r3, r4, and r5 and capacitances of the equivalent capacitors c1, c2, and c3 are all smaller than set values, that is, values of the resistances and the capacitances are set to be a little smaller. Capacitances of the cm1 and cm2 are both larger than set values, that is, values of the capacitances are set to be a little larger.

Values of the r1 and r2 are in megohm magnitude. A value of the r3 varies between several hundreds of Kohms and several ohms with an output current. Values of the r4 and r5 are dozens of Kohms. The c1 and c2 are in fF magnitude, the cm1 and cm2 are in pF magnitude, and the c3 is in uF magnitude.

An input end of the gm1 is connected to an input end Vin of the whole frequency compensation circuit. An output end of the gm1 is connected to a loop formed by the r1 and the c1, and is also connected to an input end of the gm5. An input end of the gm2 is connected to the loop formed by the r1 and the c1. An output end of the gm2 is connected to a loop formed by the r2 and the c2, and is connected to an input end of the gm4. An input end of the −gm3 is connected to the loop formed by the r2 and the c2. An output end of the −gm3 is connected to a loop formed by the r3 and the c3, and the loop formed by the r3 and the c3 is further connected to an output end Vout of the whole frequency compensation circuit. An output end of the gm5 is connected to the r5 and the cm1, and is further connected to the loop formed by the r3 and the c3. An output end of the gm4 is connected to the r4 and the cm2, and then connected to the loop formed by the r3 and the c3 through the r4 and cm2.

The gm1, the r1, and the c1 sequentially connected in series form a first transconductance operational amplifier circuit, the gm2, the r2, and the c2 sequentially connected in series form a second transconductance operational amplifier circuit, and the −gm3, the r3, and the c3 sequentially connected in series form a third transconductance operational amplifier circuit. The gm5, the r5, and the cm1 sequentially connected in series form a primary transconductance negative feedback compensation circuit, and the gm4, the r4, and the cm2 sequentially connected in series form a secondary transconductance negative feedback compensation circuit.

According to a principle of frequency compensation, as long as an open-loop phase margin of an LDO circuit is larger than 0 degree, the open-loop phase margin of the LDO circuit is generally required to be larger than 45 degrees in consideration of a process deviation, and the LDO circuit is stable when being connected as a closed loop. This requires that a frequency of at least one dominant pole of the LDO circuit is equal to a frequency of a unit gain bandwidth of the LDO or is greater than the frequency of the unit gain bandwidth. The unit gain bandwidth of the LDO loop refers to a corresponding bandwidth obtained when the gain of the LDO loop decreases to 1, and the phase margin is equal to a result obtained by subtracting from 180 degrees a phase variation of the loop obtained when the loop gain is decreased to 1.

In the case that the output current at the Vout of the frequency compensation circuit of the LDO as shown in FIG. 5 is smaller than a set value, for example, 50 μA, that is, in the case that a small current is output, the resistance of the r3 increases as the output current decreases, and the transconductance gm3 of an output stage is quite small. A dominant pole of the frequency compensation circuit is located at the output end (that is, Vout), and a calculation formula for a frequency of the dominant pole is as follows:

$$P_1 = \frac{-1}{r3 \cdot C3}.$$

Because the resistance of the r3 is quite large, the frequency of the dominant pole P1 is smaller. Two secondary poles of the frequency compensation circuits are located at output ends of the gm1 and the gm2 respectively, and calculation formulas for frequencies of the two secondary poles are as follows:

$$P_2 = \frac{-1}{r1 \cdot C1}$$

and $$P_3 = \frac{-1}{r2 \cdot C2}.$$

Because the resistances of the r1 and the r2 are smaller and the capacitances of the c1 and the c2 are smaller, the frequencies of the secondary poles P2 and P3 are larger.

In the case that a small current is output, a calculation formula for the unit gain bandwidth of the frequency compensation circuit is:

$$\frac{gm1 \cdot gm2 \cdot gm3 \cdot r1 \cdot r2}{C3}.$$

Obviously, the frequencies of the secondary poles P2 and P3 are both larger than the unit gain bandwidth, and therefore, the circuit is stable in the case that a small current is input. Because the transconductance gm3 of the output stage is quite small, and cannot meet the condition of Miller compensation, the Miller compensation does not work in the small current situation, and the primary transconductance negative feedback compensation circuit and the secondary transconductance negative feedback compensation circuit do not perform frequency compensation processing.

In the case that the output current of the frequency compensation circuit of the LDO as shown in FIG. 5 is larger than the set value, that is, in the case that a large current is output, the resistance of the r3 decreases as the output current increases, and the transconductance gm3 of the output stage is quite large. A calculation formula for the unit gain bandwidth of the frequency compensation circuit is $$\frac{gm1}{Cm1}.$$

The dominant pole $P_1$ of the frequency compensation circuit is located at the output end of the gm1, and a calculation formula for the frequency of the dominant pole $P_1$ is as follows:

$$P_1 = \frac{-1}{gm2 \cdot gm3 \cdot r1 \cdot r2 \cdot r3 \cdot Cm1}.$$

The frequency of the dominant pole P1 is quite low. Calculation formulas for the frequencies of two secondary poles are as follows:

$$P_2 = \frac{-gm2}{Cm2}$$

and $$P_3 = \frac{-gm3}{C3}.$$

The frequencies of the two secondary poles P2 and P3 are quite large, and are larger than the unit gain bandwidth of the frequency compensation circuit, so that the circuit is stable.

In the case that a large current is output, the transconductance gm3 of the output stage is quite large and meets the condition of the Miller compensation, so the Miller compensation works under the large current, and the primary transconductance negative feedback compensation circuit and the secondary transconductance negative feedback compensation circuit perform the frequency compensation processing. At this time, although the first transconductance operational amplifier circuit, the second transconductance operational amplifier circuit, and the third transconductance operational amplifier circuit do not have large amplification proportions, an operational amplifier gain of the frequency compensation circuit is still large because of the three-stage amplification.

Figure 6:
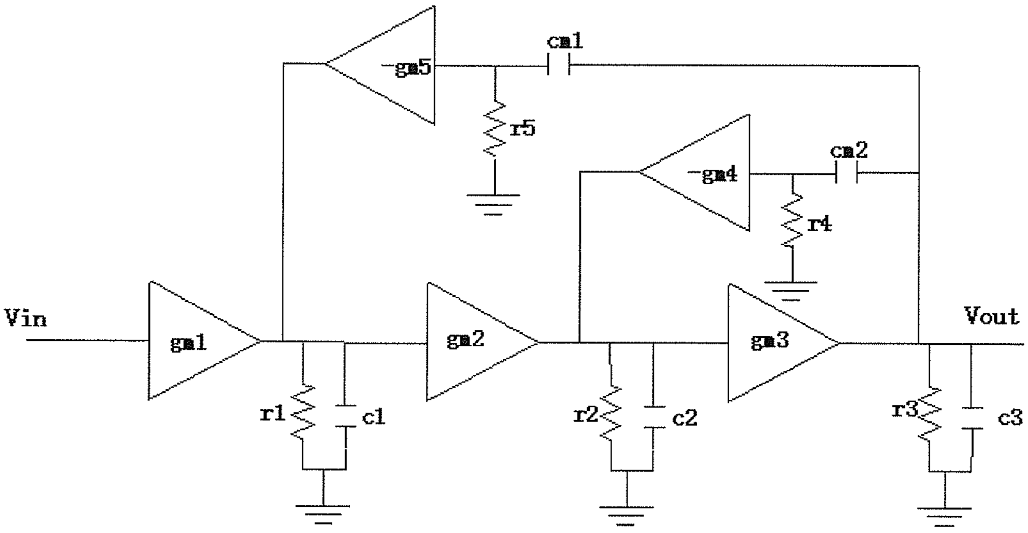
FIG. 6 is a schematic circuit diagram of specific implementation of another frequency compensation circuit for an LDO according to the second embodiment of the present invention.

In a practical application, signs of the five transconductance stages gm1, gm2, gm3, gm4, and gm5 in the FIG. 5 may be changed, but it needs to be ensured that the sign of the serial connection of the gm5, gm3, and gm2 is negative, and the sign of the serial connection of the gm4 and gm2 is negative. A schematic circuit diagram of specific implementation of another frequency compensation circuit for an LDO provided in this embodiment of the present invention is shown in FIG. 6. The frequency compensation circuit shown in FIG. 6 differs from the frequency compensation circuit shown in FIG. 5 in that the sign of the transconductance stage gm5 is changed from positive to negative, the sign of the transconductance stage gm4 is changed from positive to negative, and the sign of the transconductance gm3 is changed from negative to positive. Other parts of the frequency compensation circuit are the same as those of the frequency compensation circuit shown in FIG. 5. Calculation methods of locations and frequencies of a dominant pole and secondary poles in the frequency compensation circuit shown in FIG. 6 and calculation of a unit gain bandwidth of the frequency compensation circuit are also the same as those of the frequency compensation circuit shown in FIG. 5.

Figure 7:
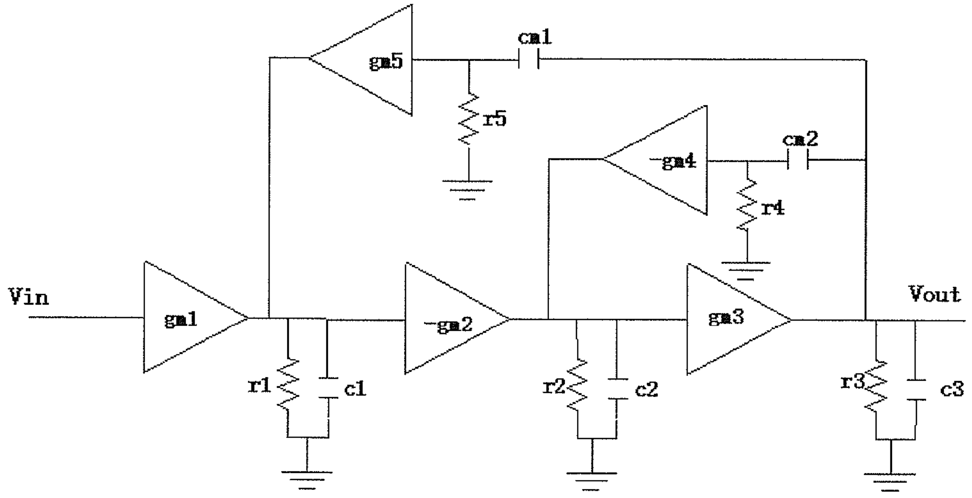
FIG. 7 is a schematic circuit diagram of specific implementation of another frequency compensation circuit for an LDO according to the second embodiment of the present invention.

A schematic circuit diagram of specific implementation of another frequency compensation circuit for an LDO provided in this embodiment of the present invention is shown in FIG. 7. The frequency compensation circuit shown in FIG. 7 differs from the frequency compensation circuit shown in FIG. 5 in that the sign of the transconductance stage gm4 is changed from positive to negative, and the sign of the transconductance stage gm3 is changed from negative to positive. Other parts of the frequency compensation circuit are the same as those of the frequency compensation circuit shown in FIG. 5. Calculation methods of locations and frequencies of a dominant pole and secondary poles in the frequency compensation circuit shown in FIG. 7 and calculation of a unit gain bandwidth of the frequency compensation circuit are also the same as those of the frequency compensation circuit shown in FIG. 5.

Figure 8:
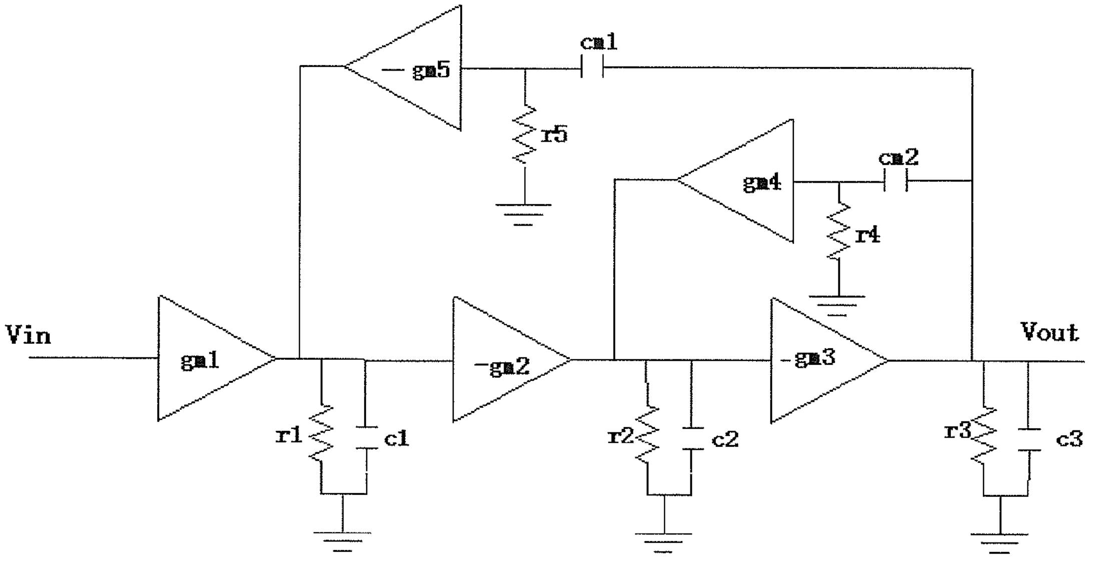
FIG. 8 is a schematic circuit diagram of specific implementation of another frequency compensation circuit for an LDO according to the second embodiment of the present invention.

A circuit diagram of specific implementation of another frequency compensation circuit for an LDO provided in this embodiment of the present invention is shown in FIG. 8. The frequency compensation circuit shown in FIG. 8 differs from the frequency compensation circuit shown in FIG. 5 in that the sign of the transconductance stage gm5 is changed from positive to negative, and the sign of the transconductance stage gm2 is changed from positive to negative. Other parts of the frequency compensation circuit are the same as those of the frequency compensation circuit shown in FIG. 5. Calculation methods of locations and frequencies of a dominant pole and secondary poles in the frequency compensation circuit shown in FIG. 8 and calculation of a unit gain bandwidth of the frequency compensation circuit are also the same as those of the frequency compensation circuit shown in FIG. 5.

It is proved through experiments that when an output current is quite large (for example, 300 mA), the unit gain bandwidth of the frequency compensation circuit of the LDO shown in FIG. 7 is still quite large, almost equal to 77.5 dB, a phase margin is approximately 90 degrees, and the frequency compensation circuit is stable. When the output current is small (for example, 76 μA), the phase margin is 58 degrees, and the frequency compensation circuit is also stable.

Those of ordinary skill in the art may understand that, all or a part of processes in the method according to the embodiments may be accomplished by a computer program instructing relevant hardware. The program may be stored in a computer-readable storage medium. When the program is executed, the processes of the method according to the embodiments of the present invention are performed. The storage medium may be a magnetic disk, an optical disk, a read-only memory (ROM), and a random access memory (RAM).

In sum, in the embodiments of the present invention, by using a structure of a three-stage transconductance operational amplifier circuit and two-stage compensation circuit, in the case that various types of currents are output, a loop of a frequency compensation circuit of a voltage regulator, such as an LDO, may be enabled to maintain stable; furthermore, an operational amplifier gain of the frequency compensation circuit may be enabled to be larger.

Embodiments of the present invention solve a problem that an existing current Miller frequency compensation circuit has a small frequency compensation gain in the case that a large current is output, so that performances of a frequency compensation circuit of an LDO related to the frequency compensation gain, such as load regulation, output voltage precision, and power supply noise suppression are greatly improved.

The preceding descriptions are merely some exemplary embodiments of the present invention, and are not intended to limit the protection scope of the present invention. Any variation or replacement that may be easily thought of by persons skilled in the art without departing from the technical scope disclosed by the present invention shall all fall within the protection scope of the present invention. Therefore, the protection scope of the present invention shall be subject to the protection scope of the appended claims.

What is claimed is:

1. A frequency compensation circuit for a voltage regulator, comprising:

a first transconductance operational amplifier circuit, a second transconductance operational amplifier circuit, and a third transconductance operational amplifier circuit cascaded sequentially, wherein the first transconductance operational amplifier circuit receives an input voltage to be compensated, and the third transconductance operational amplifier circuit outputs a compensated voltage; and a primary transconductance negative feedback compensation circuit, connected in parallel between an output end of the second transconductance operational amplifier circuit and an output end of the third transconductance operational amplifier circuit, and a secondary transconductance negative feedback compensation circuit, connected in parallel between an output end of the first transconductance operational amplifier circuit and the output end of the third transconductance operational amplifier circuit.

2. The frequency compensation circuit for a voltage regulator according to claim 1, wherein:

the first transconductance operational amplifier circuit comprises: a first transconductance, a first resistor, and a first capacitor sequentially connected in series;

the second transconductance operational amplifier circuit comprises: a second transconductance, a second resistor, and a second capacitor sequentially connected in series;

the third transconductance operational amplifier circuit comprises: a third transconductance, a third resistor, and a third capacitor sequentially connected in series;

the primary transconductance negative feedback compensation circuit comprises: a fourth transconductance, a fourth resistor, and a second compensation capacitor sequentially connected in series; and the secondary transconductance negative feedback compensation circuit comprises: a fifth transconductance, a fifth resistor, and a first compensation capacitor sequentially connected in series.

3. The frequency compensation circuit for a voltage regulator according to claim 2, wherein:

a sign of the third transconductance is negative.

4. The frequency compensation circuit for a voltage regulator according to claim 2, wherein:

a sign of the fourth transconductance is negative, and a sign of the fifth transconductance is negative.

5. The frequency compensation circuit for a voltage regulator according to claim 2, wherein:

a sign of the second transconductance is negative, and a sign of the fourth transconductance is negative.

6. The frequency compensation circuit for a voltage regulator according to claim 2, wherein:

a sign of the second transconductance is negative, a sign of the third transconductance is negative, and a sign of the fifth transconductance is negative.

7. The frequency compensation circuit for a voltage regulator according to claim 2, wherein:

when an output current of the third transconductance operational amplifier circuit is smaller than a set value, a resistance of the third resistor is larger than a set value, the third transconductance of an output stage is smaller than a set value, and the primary transconductance negative feedback compensation circuit and the secondary transconductance negative feedback compensation circuit do not perform frequency compensation processing; a dominant pole of the frequency compensation circuit is located at the output end of the third transconductance operational amplifier circuit, two secondary poles of the frequency compensation circuit are located at the output end of the first transconductance operational amplifier circuit and the output end of the second transconductance operational amplifier circuit respectively, frequencies of the two secondary poles are larger than a unit gain bandwidth of the frequency compensation circuit, and the primary transconductance negative feedback compensation circuit and the secondary transconductance negative feedback compensation circuit do not perform the frequency compensation processing.

8. The frequency compensation circuit for a voltage regulator according to claim 2, wherein:

when an output current of the third transconductance operational amplifier circuit is larger than a set value, a resistance of the third resistor is smaller than a set value, the third transconductance of an output stage is larger than a set value, and the primary compensation circuit and the secondary compensation circuit perform frequency compensation processing; a dominant pole of the frequency compensation circuit is located at the output end of the first transconductance operational amplifier circuit, frequencies of secondary poles of the frequency compensation circuit are larger than a unit gain bandwidth of the frequency compensation circuit, and an operational amplifier gain of the frequency compensation circuit is larger than a set value through amplification processing by the first transconductance operational amplifier circuit, the second transconductance operational amplifier circuit, and the third transconductance operational amplifier circuit.

* * * * *